(12) United States Patent
Kane et al.

(10) Patent No.: US 6,379,510 B1
(45) Date of Patent: Apr. 30, 2002

(54) METHOD OF MAKING A LOW VOLTAGE MICRO-MIRROR ARRAY LIGHT BEAM SWITCH

(76) Inventors: Jonathan S. Kane, 27 Wilshire Dr., Londonderry, NH (US) 03503; Gareth A. Hughes, 2492 Arlington Ave. East, Maplewood, MN (US) 55119

( * ) Notice: Subject to any disclaimer, the term of this patent is extended or adjusted under 35 U.S.C. 154(b) by 0 days.

(21) Appl. No.: 09/714,505

(22) Filed: Nov. 16, 2000

(51) Int. Cl.[7] ............... B81C 1/00; C23C 14/34; C23F 1/00; H01L 21/00
(52) U.S. Cl. .............. 204/192.34; 204/192.27; 216/67; 438/29; 438/31; 427/579; 427/588; 427/100
(58) Field of Search ........ 204/192.34, 192.27; 427/579, 588, 255.37, 100, 125, 162; 216/67; 438/29, 31; 29/25, 35

(56) References Cited

U.S. PATENT DOCUMENTS 6,094,294 A * 7/2000 Yokoyama et al. ......... 359/290
6,201,629 B1 * 3/2001 McClelland et al. ........ 359/223

* cited by examiner

Primary Examiner—Nam Nguyen
Assistant Examiner—Gregg Cantelmo
(74) Attorney, Agent, or Firm—Robert Nathan

(57) ABSTRACT

A method of making a micro-mirror light beam switch having a thin flexible movable support member for supporting a thin central reflective mirror surface thereon and for supporting a plurality of thin unimorph piezoelectric cantilevered mirror actuators mechanically coupled between a fixed substrate and movable hinging portions of the thin movable support member. The method employs thin film deposition techniques and photolithography for readily forming the extremely thin switch, whereby the components thereof are substantially co-planar for precisely controlled, multi-axial micro-mirror motion and low voltage operation necessary for the rapid switching of optical traffic from fiber to fiber in the next-generation optical networks.

13 Claims, 10 Drawing Sheets

METHOD OF MAKING A LOW VOLTAGE MICRO-MIRROR ARRAY LIGHT BEAM SWITCH

BACKGROUND OF THE INVENTION

The present invention relates to a method of making an optical beam switching device described herein and which is claimed in co-pending application 09/714,253 filed on the same day as this invention namely Nov. 16, 2000.

The growing demand for increased data rate transmission throughout communication networks has recently created tremendous interest in the field of fiber optic telecommunication. With the deployment of fiber optic cables and the use of dense wave division multiplexing (DWDM), optical data transmission has allowed much greater transmission rates in comparison to its electrical counterpart. Fiber optic cables, each carrying multiple wavelengths of light, are replacing metallic cables. Each wavelength of light denotes a data channel in similar fashion to the multiplexed frequencies that denote television channels traveling through an electrical coaxial cable. Transmission of each optical signal begins with a wavelength-tuned light source at the entrance of the fiber optic cable. Each data channel or wavelength requires a light source emitting at the appropriate wavelength. The optical signals then travel throughout the network and are eventually delivered to the proper destination.

For each data stream to reach its destination, several different components located at junctions throughout the optical network are required. At these junctions, the components must perform tasks such as adding and dropping data from the optical stream, multiplexing and de-multiplexing of the data into and out of the fiber carrier, and switching and routing each data signal between optical fibers to reach its intended destination. In current fiber optic networks, many of these tasks are performed by opto-electronic components such that incoming photonic signals are converted to electrical signals before being manipulated at these junctions. For example, as an optical data stream arrives at a switching node to be switched onto another fiber, each optical signal is first converted into an electrical signal, which is then transmitted through an electrical circuit. The signals are then directed throughout the electrical circuit to the entrance of the appropriate fiber. The electrical signals must then be converted back to their optical forms before being passed along to the targeted fiber. The optical signals continue to travel throughout the optical network, transforming between optical and electrical states until the intended destination is reached.

As the demand for bandwidth increases, more opto-electronic components will be necessary to handle the increased data traffic. Additionally, existing opto-electronic interfaces currently being used cannot be utilized as advances in optical transmission are achieved. Therefore, as light sources develop and more wavelengths are transmitted along a fiber, existing opto-electronic components will need to be replaced. Furthermore, as more opto-electronic devices are deployed, more electrical power is consumed. The added cost of power consumption and the cost and time needed for device replacement has created a demand for alternative methods of photonic signal direction throughout fiber optic networks. The inherent non-scalability of existing opto-electronic interfaces presents a bottleneck in the progression of next-generation telecommunications.

One proposed remedy is the use of optical devices that maintain the transmitting signals in the optical domain while switching and cross connecting from fiber to fiber such that no opto-electronic conversions are required. A method currently being market tested and also being proposed in the present invention is the use of micromirror arrays to reflect light from a fiber entering the junction to a targeted fiber for continuation of the signal to its appropriate destination. Through the use of micro-electromechanical systems (MEMS) techniques, micromirror arrays containing individually movable mirrors can be accurately manufactured.

Current MEMS micromirror arrays developed and being tested for fiber optic switching are actuated via either electrostatic or electromagnetic forces. The most common method of actuation in MEMS-based devices is currently electrostatic actuation. Such devices typically take the form of air-gap capacitors comprising a movable top electrode, a fixed bottom electrode, and air as the dielectric between the electrodes. Electrostatic forces between the electrodes causes motion in the freely movable top electrode. One limitation of electrostatic devices is the air-gap thickness, which dictates the range of motion for the top electrode. Furthermore as the air gap increases, greater voltage is required for actuation. Since it is an air gap the problem of stiction arises where the top mirror can be stuck to the bottom electrode, hence making the device useless. This problem known as "stiction" is common to these types of devices. This can occur even during the fabrication process which results in lowered yields.

Electromagnetic MEMS-based devices utilize magnetic materials co-deposited onto the device along with coils external to the device for magnetic field generation. Such devices present a solution to the air-gap restrictions of electrostatic devices, although low voltage operation is still a challenge. Furthermore, the added need for external coils creates a larger device profile.

Therefore, there is still a demand for small form factor, low voltage operating optical switches for enabling all-optical networking. Such a device is a piezoelectrically actuated micromirror. An applied voltage across a piezo-electric material, such as quartz, barium titanate, and lead zirconium titanate, deforms the material proportionally to the voltage being applied. This deformation can be used as an actuating mechanism. Piezoelectric materials are widely used in applications where precise actuation is required such as atomic force microscopy and linear micro-positioning for electron beam lithography. Until recently, most applications have used bulk piezoelectric ceramics that required high voltage for operation. To take advantage of the precise positioning of piezoelectric actuation in MEMS devices, thin film piezoelectric materials have been developed utilizing deposition techniques such as sol-gel, metal organic chemical vapor deposition (MOCVD), and sputtering. With the use of thin film piezoelectric materials, much lower operating voltages can be utilized in comparison to bulk piezoelectric materials.

In contrast with the following prior art, the present invention uses a coplanar arrangement of extremely thin, very low voltage operated cantilevered actuators and mirrors such that one or more actuators are located on each side of each mirror enabling highly precise multi-axial motion of each mirror, often in push-pull mode.

Examples of MEMS micro-actuators utilizing piezoelectric elements can be found outlined by Furuhata and Hirano, U.S. Pat. Nos. 5,351,412, 5,489,812, and 5,709,802 and by Motamedi et al. in U.S. Pat. No. 5903380. The inventions proposed by Furuhata and Hirano incorporate a laminated structure formed by bonding metalized piezoelectric elements to the MEMS fabricated structure. A shortcoming of this device and method is the process of bonding a piezoelectric element to another substrate. The said method must utilize piezoelectric elements that can be adequately handled and positioned, this implies a larger operating voltage than the use of a deposited thin piezoelectric film which can be on the order of several microns thick or less. Furthermore, the efficiency of actuation is dependent upon the placement accuracy and bonding efficacy between the piezoelectric element and the MEMS structure. These shortcomings are resolved in the present invention by utilizing thin film deposition techniques and accurate photolithography. Motamedi at al. outline in their invention a low voltage optical resonator comprising sputtered zinc oxide (ZnO) as the piezoelectric material and claim operating voltages of 2 volts AC. Piezoelectric materials such as PZT have higher piezoelectric coefficients in comparison to ZnO, which provide larger actuation for a given applied voltage as claimed in the present invention.

U.S. Pat. No. 3,758,199: Thaxter, "Piezoelectrically Actuated Light Deflector"

This is a bulk device. We employ thin films and microfabrication methods for manufacturing, enabling high volume, precision manufacturing. Column 3 (line 35) mentions the use of epoxy for bonding the various parts together, which implies bulk materials. In addition, the use of microfabrication methods with our invention enables the manufacture of devices with much smaller form factor than this invention. A smaller device will have higher resonance frequency enabling faster switching and a much lower operating voltage. Column 2 (line 31) describes the cantilever actuator motion; the device is utilizing the extension mode of operation. One cantilever pushes up on the mirror while the other cantilever pulls down. Our design uses coplanar cantilevers utilizing a flexural mode of operation. This again enables the manufacture of a small form factor device and lends itself to microfabrication methods. Also, in column 2 (line 42), hinges are mentioned. The hinges link the cantilevers to the underside of the mirror at 90-degree angles and articulate when the cantilevers are actuated. This configuration will concentrate the stress directly at the 90-degree elbow in the hinge, which could cause premature fatigue failure. Our design uses a coplanar configuration of the hinge, cantilevers, and mirror creating no stress concentrations. Furthermore, the hinges and supporting structure located underneath the mirror and actuators for our design are fabricated of the same material, which again enables the use of microfabrication methods. Again in Column 2 (line 35) and FIG. 1, the author discloses a mirror that is at right angles to the PZT material. In other words as the PZT material flexes the mirror is rotated. In our case the cantilever are coplanar to the mirror surface and attached through hinges in the coplanar geometry. So not only is our form factor smaller as mentioned above but the entire geometry is different.

U.S. Pat. No. 3,981,566: Frank et al., "Lever-action Mountings for Beam Steerer Mirrors"

This is another bulk device having similar disadvantages as Thaxter mentioned above. As in Thaxter, Frank's hinge arrangement concentrates the stress at the elbow.

U.S. Pat. No. 5,367,584: Ghetto et al., "Integrated Microelectromechanical Polymeric Photonic Switching Arrays"

Waveguide arrays are fabricated and switching between the waveguides occurs by actuating a portion of one waveguide causing it to come into contact with an adjacent waveguide. Light propagating through the first waveguide is then transferred to the adjacent waveguide. Some loss will occur with this approach as the light passes through the electrodes located between the waveguides. In addition, sacrificial etching is used to creating air gaps, which pose stiction problems during fabrication.

U.S. Pat. No. 5,761,350: Koh, "Method and Apparatus for Providing a Seamless Electrical/optical Multilayer Micro-optico-elettro-mechanical System Assembly"

This patent discloses the use of flip chip bonding and, wafer bonding to form multichip modules. Firstly, the mirrors in this case are fixed; they are only used to direct incoming light to a photodetector located above the mirror. This is essentially a compact optoelectronic device. However, the patent uses a couple of low temperature materials, optical epoxy and polyimide, in their structure. The flip chip bonding technique mentioned is C4 bonding which is a solder reflow type and typically occurs around 250 deg. C. This temperature could also cause reflow in the polyimide and optical epoxy rendering their device useless. The device of the present invention does not have such temperature constraints and we employ a polymer flip chip approach, which utilizes a lower temperature.

U.S. Pat. No. 5,771,321: Stern, "Micromechanical Optical Switch and Flat Panel Display"

This invention depicts a different optical switch primarily for display applications utilizing electrostatic actuation. Display applications require less speed and have little or no positioning stringency for the actuated mirror. Typically, the mirror needs to move at frame rate (30 Hz) and deflects light such that the pixel attributed to the mirror is either on or off. For our device, the optical switch must be switchable at higher speeds (1 kHz) and have accurate positioning for directing optical traffic to the appropriate fiber. Although, flip chip bonding is mentioned, but no details are described. There are several different methods of flip chip bonding and furthermore, Stern mentions the possible use of polymeric materials in their device which could pose problems when flip chip bonding as previously mentioned in connection with the Koh patent.

U.S. Pat. No. 5,808,780: McDonald, "Non-contacting Micromechanical Optical Switch"

This invention depicts an electrostatic mirror for optical switching. This device is only utilized in one dimension, up and down with respect to the substrate. The arrangement of the cantilevers shown in FIG. 1b could allow for tilting action perhaps somewhat similar to our device, however, the axis of rotation will not be through the center of the mirror. The axis of rotation for this device if used for tilting would be located along the imaginary line through the mirror formed by connecting opposing cantilevers at points where they are attached to the mirror. This motion would cause an elongating stress to the other 2 cantilevers not being used for actuation as the mirror will pull away from these remaining 2 cantilevers. The design of the preferred embodiment of the present invention, places each cantilever at the center of each edge, so that when 2 opposing cantilevers are actuated, the remaining 2 non-actuated mirrors are only slightly torsionally rotated. This motion induces much less stress than elongation, which can produce premature creep in a material. FIG. 2 and the middle of column 3 suggest that the device can be run in a tilting mode. The tilting is describes as more of a "torqueing" of the mirror surface than actually tilting the mirror. With this torqueing, much stress will be induced with this geometry and thus the "torqueing" provides very limited angular motion. The electrode structures suggested in FIG. 3a–c are used for fine tuning of the mirror location. More electrodes provide for finer tuning which is necessary for accurate optical switching between fibers. However, each electrode must have an electrical connection and, therefore, more electrodes require more connections which make the overall size of the device larger. Our preferred design of the present invention utilizing piezoelectric actuation, has fine tuning through the use of only varying the driving voltage; piezoelectric actuators inherently provide precise positioning. Finally, the reference "To CMOS" in FIG. 1a refers to the MEMS device which was fabricated on the top of a CMOS-processed silicon wafer. Essentially the MEMS device was built up on the silicon substrate, which already had the CMOS, patterned. Flip chip bonding is not implied here. Note that for this device to work, it is required that the reflective surfaces be aligned with the device. In other words the reflective surfaces shown in the cover page figure (number 32 in the figure) are an intrinsic part of the device. Our device will tilt via the actuators, they will not just move up and down. Also a fundamental difference is that this is essentially an air gap capacitor so that there is a limit to the distance of motion (that of the air gap). In our invention, with a cantilever driving structure there is no air gap and hence no problems with stiction (the mirror sticking on the bottom) or limitations in depth due to air gap size.

U.S. Pat. No. 5,870,007: Carr et al., "Multi-dimensional Physical Actuation of Microstructures"

This invention describes several actuation structures and mechanism. The invention mostly concentrates on thermal actuation, the use of a bimorph structure with 2 materials of different TCEs (thermal coefficients of expansion), essentially a thermocouple. Such thermal actuation methods can provide large motion, but at the sacrifice of speed. The material must heat up and cool down which is much slower than the motion of an electron (electrostatic actuation) or dipole switching (piezoelectric actuation). This invention has a few piezoelectric and electrostrictive references, however, the author seems to interchange the two terms. Piezoelectric materials are not the same as electrostrictive (see column 5, line 25). They are classified by crystal structure; piezoelectrics are asymmetrical whereas electrostrictive materials are symmetrical. A piezoelectric material, such as PZT, is first poled to align the dipoles allowing for actuation. An electrostrictive material, such as PMN, is actuated by continuously applying a DC voltage to the material and then varying the voltage amplitude. Furthermore, the motion induced by either piezoelectric or electrostrictive means is created from the transferal of stress from the actuating material to the underlying structure and not by "differential stress" typical of thermal actuation as mentioned in column 5, line 39. This particular invention seems more concerned with larger actuation than on precise, fast actuation that we are proposing for the optical switch of the present invention. The preferred embodiment is detailed in FIG. 3 (see column 3, line 15 reference) as with all of the descriptions this is a cantilever structure that does not rely on hinging but instead places the cantilever directly under the mirror structure and relies on the bending of the cantilever. Ours is a hinged device. Furthermore they do not have the two dimensional push-pull action disclosed in our invention.

In comparison to the cross connect optical switch proposed by Solgaard et al. (U.S. Pat. No. 6,097,859), several improvements are rendered with our invention. The switch by Solgaard utilizes polysilicon micromachining technology, a subset of MEMS technology. In polysilicon micromachining, the structural material is polysilicon and sacrificial etches are used to create freestanding structures. One inherent problem with polysilicon is the intrinsic stress of the deposited thin film. The intrinsic stress can be great enough to cause buckling or even fracturing of the freestanding structure. Additionally, the use of sacrificial etching to remove the sacrificial layer from underneath the polysilicon can create stiction problems. Stiction can occur after the sacrificial etch causing the polysilicon structure to become permanently stuck to the substrate, thus no longer achieving a freestanding structure. Furthermore, the invention utilizes a landing electrode, which stops the mirror at the appropriate location. This mechanism is typically used in electrostatic actuation due to the inherent flutter that can occur with this type of actuation. The use of a landing electrode can pose problems with contact wear after numerous cycles of the actuators and mirrors hitting the landing electrode. Finally, the said invention utilizes electrostatic torsional actuation, which calls for complex driving circuitry. In order to achieve precise control of the mirror, the location of the rotation axis must be also controlled. Due to the mirror being a floating structure, the axis of rotation can move as the mirror is moved. Such action can produce a wobbling effect unless proper control of the rotation axis is achieved.

Our present invention addresses and improves upon the above short falls of the Solgaard invention. Firstly, our structural material is low stress silicon nitride. Much lower intrinsic stress is observed in this material in comparison to polysilicon. Therefore, flatter structures can be manufactured. Secondly, sacrificial etching is not used in our invention to create freestanding structures. Deep reactive ion etching (DRIE) of the substrate is used to completely remove the substrate material from beneath the mirrors and actuators of our invention. Therefore, stiction will not be a problem, as no substrate will remain underneath any of the moving structures. Thirdly, our optical switch uses piezoelectric actuation. With piezoelectric actuation, no landing electrode is necessary. Therefore, contact wear will not be a problem. Finally, the piezoelectric actuators are used in a flexural mode, therefore, with the inherent linearity of piezoelectric materials, much simpler driving circuitry can be used.

In comparison to the optical matrix switch proposed by Laor (U.S. Pat. No. 6,097,860), the Solgaard patent proposes electromagnetic actuation for each of the mirrors in the optical matrix. The mirror itself is a gimbal mounted structure allowing 2-axis motion. Several issues can be foreseen with such a design. Firstly, to achieve electromagnetic actuation, chip mounted electromagnetic elements (such as coils) must be located around each mirror. This entails a manufacturing challenge due to the necessary placement and mounting of each electromagnetic element around each mirror. Such elements are difficult, if not, impossible to fabricate with current MEMS-compatible processes. Therefore, such fabrication and placement of said electromagnetic elements involves additional processes, further complicating the manufacturing process. Secondly, the overall size of each packaged mirror must be adequately large enough in order to accurately place each said electromagnetic element. Therefore, larger mirror chips are typically required when compared to mirrors that are electrostatically or piezoelectrically actuated. Finally, each mirror must be adequately spaced apart so that fringe field effects are minimized from each of the electromagnetic elements. If mirror spacing is not large enough, the magnetic fields emanating from electromagnetic elements surrounding one particular mirror may induce unwanted magnetic effects in other surrounding mirrors. To finalize the critique of electromagnetic mirror arrays, one can see that as the mirror array contains more mirrors, the overall size of the unit containing the whole mirror array can become quite large in comparison to electrostatic or piezoelectric devices.

Our present invention greatly improves on the size requirements for electromagnetic mirror arrays by using both piezoelectric actuation and CMOS driving circuitry, which is packaged with each mirror array. The use of piezoelectric actuation enables all materials and structures required to be fabricated utilizing existing MEMS processes and takes advantage of the manufacturing capabilities thereof. Furthermore, the actuators for each mirror are spatially and accurately located within microns of the mirror. This is again achievable due to the use of existing photolithographic processes currently available in the MEMS and semiconductor industries. Finally, the use of extremely thin film piezoelectric material requires less than 5V DC for full actuation which enables each mirror array to be packaged with its own CMOS-compatible driving circuitry creating a small form factor module.

Min et al. (U.S. Pat. No. 6,030,083), proposes similar thin film piezoelectric actuation. However, each actuated mirror is located above its respective cantilever actuator enabling only single axis motion. Our present invention uses a coplanar arrangement of the actuators and mirrors such that one or more actuators are located on each side of each mirror enabling multi-axial motion of each mirror. Furthermore, the said invention is proposed for the purpose of image projection and is concerned only with frame rate oscillations, which typically occur at a cycle rate of 30 Hz. The purpose of our present invention is for the redirection of light from fiber optic cables which will require accurate positioning and much faster response times on the order of 1 millisecond (1000 Hz).

SUMMARY OF A PREFERRED METHOD OF MAKING THE SWITCH

The present invention involves a method of making the novel micro-mirror light beam switch described herein, and claimed in the aforesaid copending application, the switch having a thin flexible movable support member for supporting a thin central reflective mirror surface thereon and for supporting a plurality of thin unimorph or bimorph piezoelectric cantilevered mirror actuators, mechanically coupled between a fixed substrate and movable hinging portions of the thin movable support member. The method employs thin film deposition techniques and photolithography for readily forming the extremely thin switch, whereby the components thereof are substantially co-planar. A silicon nitride or silicon dioxide support member layer is deposited over a silicon substrate and two metallic electrode layers and a piezoelectric layer are thereafter deposited upon the support member layer. Then, these layers are etched away to form extremely thin piezoelectric actuators that can be driven by low voltage CMOS driver circuitry. The support member layer is also etched away to form a flexible actuator support member, and finally a reflective mirror surface is deposited on the underside of the flexible actuator support member.

The micro-optical switch made in accordance with the method claimed herein below utilizes a piezoelectric material, preferably PZT for low voltage micro-mirror actuation with highly accurate positioning, and greatly improves on the size requirements for electromagnetic mirror arrays by using both piezoelectric actuation and CMOS driving circuitry, which is packaged with each mirror array. In other words the drive voltage can be analog, digital or binary as required. The use of piezoelectric actuation enables all materials and structures required to be fabricated utilizing existing MEMS processes and takes advantage of the manufacturing capabilities thereof.

Furthermore, the actuators for each mirror are spatially and accurately located within microns of the mirror. This is again achievable due to the use of existing photolithographic processes currently available in the MEMS and semiconductor industries. Finally, the use of extremely thin film non-bulk piezoelectric material only requires less than 5V DC for full actuation which enables each mirror array to be packaged with its own CMOS-compatible driving circuitry creating a small form factor module.

The novel micro-optical switch comprises a MEMS (Micro-Electromechanical Systems) micromirror array with packaged CMOS driving circuitry. Extremely thin micromirrors and PZT actuators are employed so that these components are substantially co-planar. The low operating voltage of the MEMS non-bulk extremely thin mirror actuators enable the use of typical 5-volt or less CMOS circuitry. The appropriate driving circuitry can be processed separate from the MEMS fabrication with the final device being a hybrid of a MEMS chip and a CMOS chip bonded together. In the currently most preferred embodiment of the switch, each square micro-mirror in the array is comprised of a centrally located, highly reflective material of known composition and thickness, coupled around its periphery to the movable ends of four orthogonal cantilever structures. The movable end of each actuator is coupled to the mirror periphery via flexible hinge portions of the silicon-based support sheet member. The silicon substrate is preferentially removed from beneath each central mirror area to enable forming this thin flexible mirror and actuator silicon-based support sheet member for supporting a reflective mirror surface and the movable portions of the actuators. The four orthogonal extremely thin cantilever actuators are thus coupled to each reflective mirror surface via hinging portions of the flexing support sheet, to form a floating device for each mirror. Each cantilevered actuator is attached to the fixed array substrate only at its fixed end. Furthermore, each cantilever actuator structure is of a unimorph or bimorph construction consisting of a patterned thin film of known thickness such as silicon nitride or silicon dioxide for structural support and a PZT capacitor as the actuator.

By applying a low voltage to each extremely thin PZT actuator capacitor, the stress induced in the PZT material creates a stress in the attached support material. The transferal of stress to the support material, which is anchored to the substrate at one end in similar fashion to a diving board, causes upward or downward motion to occur at the opposite movable end of the cantilever, dependent upon on the polarity of the applied voltage. Additionally, the amount of motion can be precisely controlled through control of the applied voltage. Each cantilever structure, coupled to each side of the square micro-mirror via a hinge member, is individually addressable, allowing multi-axial movement of each micro-mirror. Thin and flexible support sheet portions adjacent movable terminal portions of the cantilevered actuators, act as stress relieving hinge flexing areas, relieving stress from the stiffer actuators.

To achieve a tilting motion about an axis, the PZT actuators located perpendicular to the desired axis of rotary mirror motion, are addressed with opposing potentials such that one cantilever moves upward while the opposing cantilever moves downward. This in turn tilts the mirror about the desired axis. Also, by applying opposing potentials to the remaining two cantilevers in similar fashion, 2-axis motion is realized. Finally, through the application of equal polarity to all actuators, a parallel motion with respect to the substrate can be achieved. This precisely controlled, multi-axial motion of each micro-mirror provides the accuracy and low voltage operation necessary for the rapid switching of optical traffic from fiber to fiber in the next-generation optical networks.

BRIEF DESCRIPTION OF THE DRAWINGS

The various features of the invention will become more apparent upon reading of the following detailed description, taken in conjunction with the drawings in which:

FIG. 1b discloses an isometric view of the array structure of FIG. 1a;

DETAILED DESCRIPTION OF THE INVENTION

Figure 1:
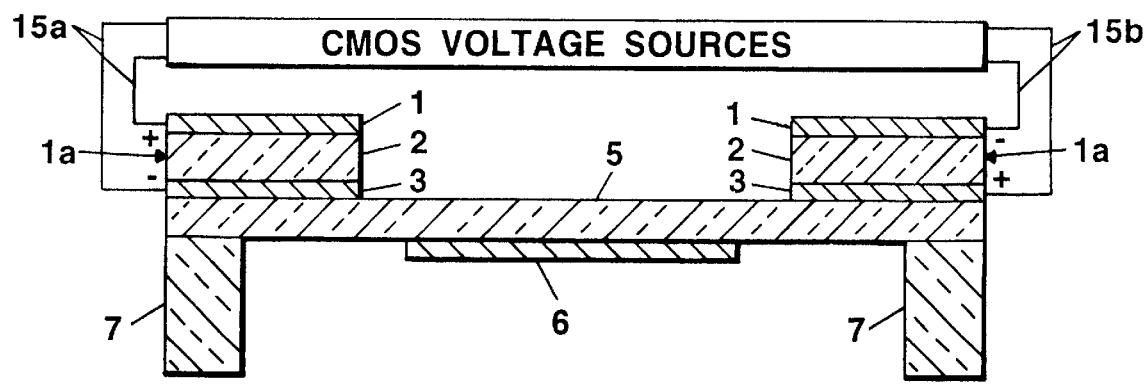
FIG. 1 shows a cross sectional view taken through A—A of FIG. 1c.
Figure 1A:
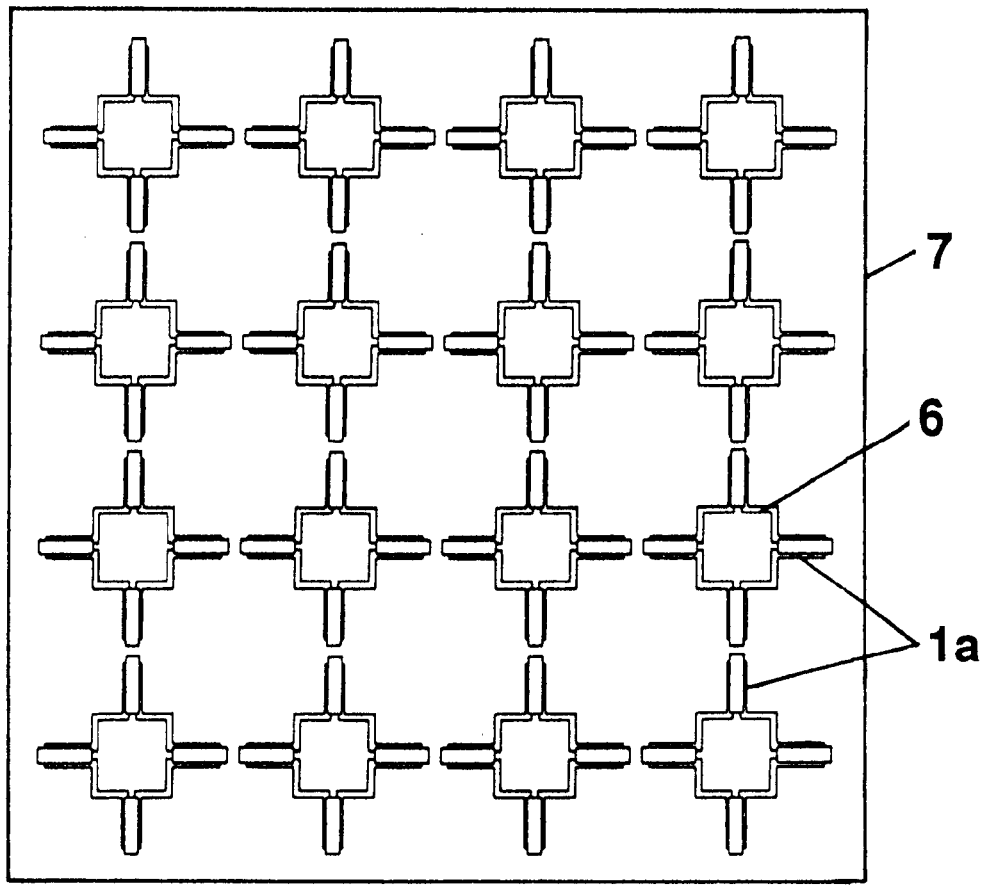
FIG. 1a is a top view of an array of sixteen micro-mirrors on a silicon substrate, each including four actuators for providing two dimensional steering of light beams.

FIG. 1a discloses a sample array of 16 micro-mirrors 6 with actuator 1a mounted upon silicon substrate 7.

Figure 1B:
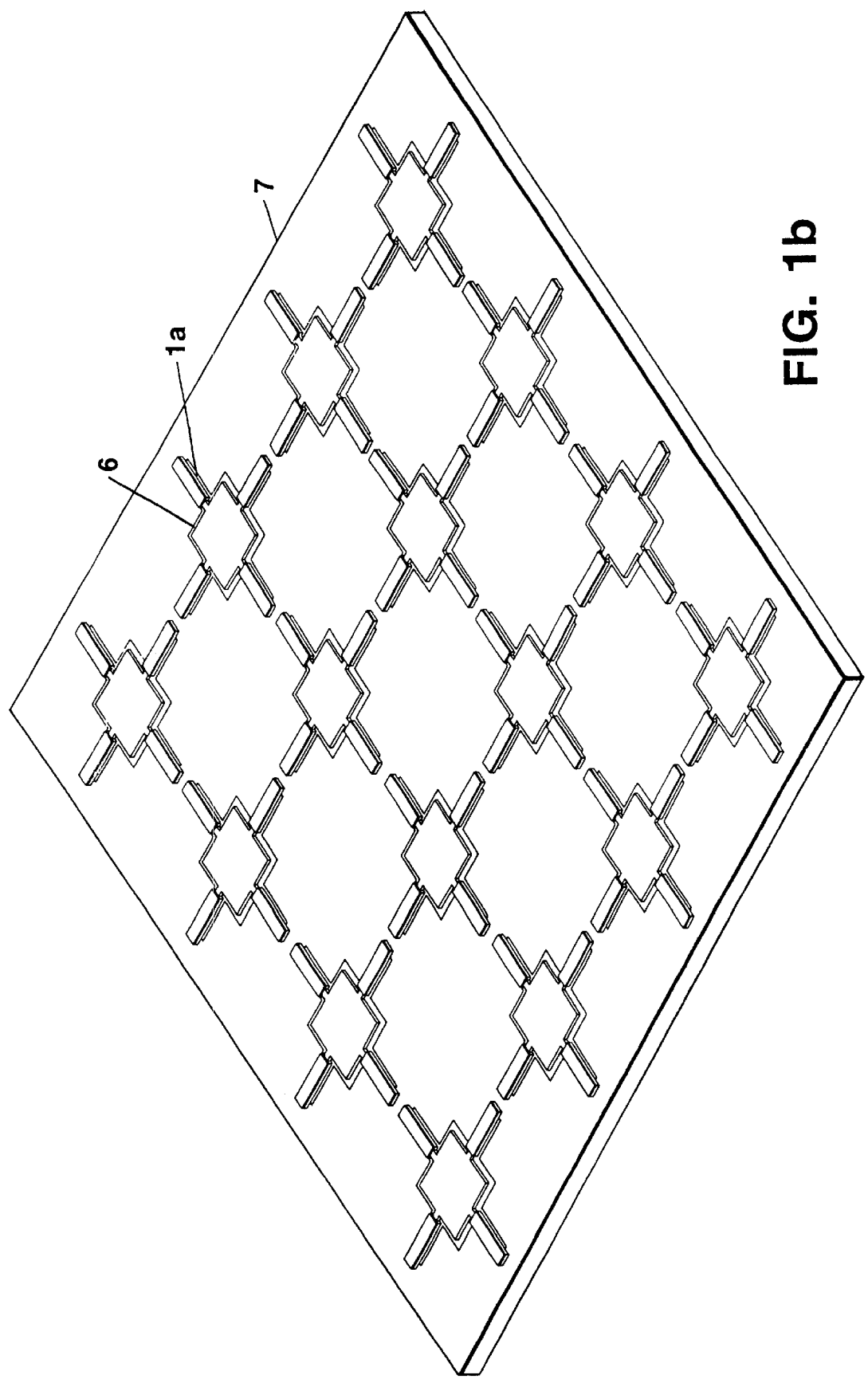
Figure 1C:
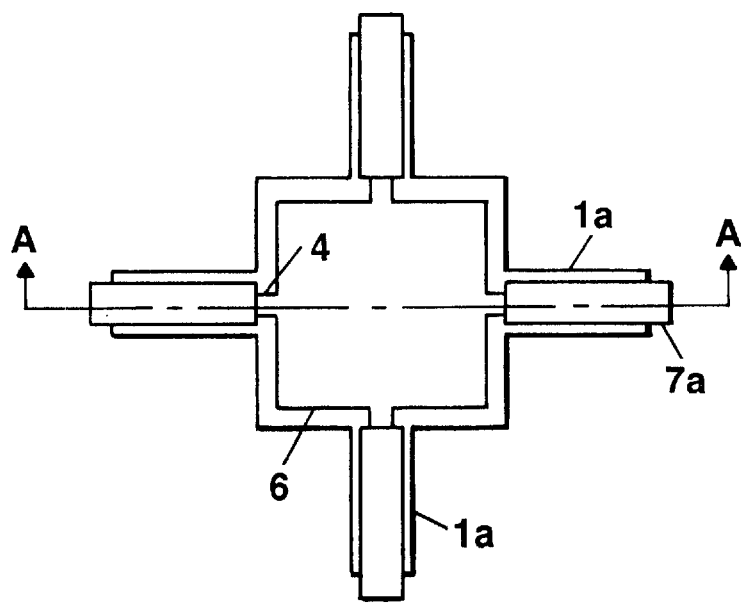
FIGS. 1c and 1d show a top view and an isometric view respectively of a single presently preferred micro-mirror of the invention.

FIG. 1b is an isometric view of the array of FIG. 1a. FIG. 1c is a top view of a single mirror 6, controlled by four actuators 1a. A small fixed portion of each actuator is attached to the substrate 7 for anchoring, such that a cantilever structure like a diving board is created. Movable end portions of each actuator are flexibly coupled to the central mirror support via narrow flexible tabs, functioning as hinging areas 4 of the support sheet. See also tab portions 4 in FIG. 9. The hinging areas reduce potentially damaging actuator stress concentrations.

Figure 1D:
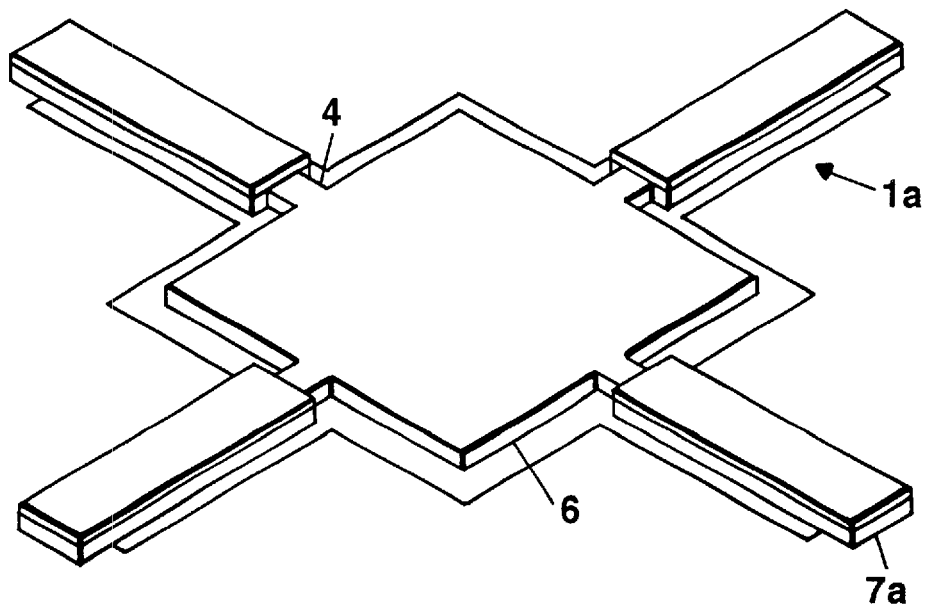

FIG. 1d is an isometric view of single mirror element 6. The actual reflective mirror surface is located underneath the central square structure 6a such that the light source emits an upward light beam through the defined areas in the silicon substrate 7 and is reflected by the reflective mirror surface. Again, each actuator, composed of a PZT capacitor 1a is anchored to the substrate 7 as shown at 7a.

Figure 15:
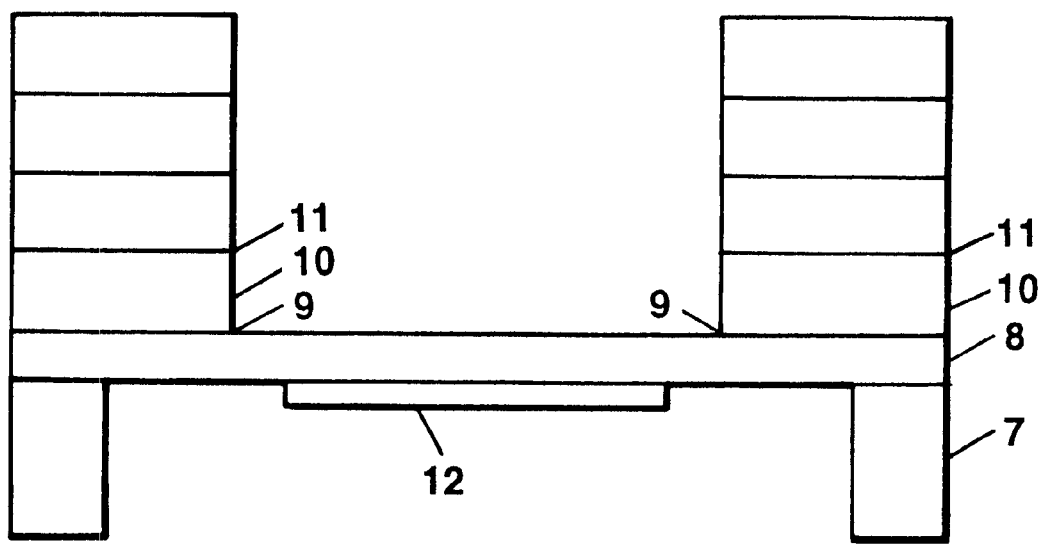
FIG. 15 shows a further embodiment employing PZT stack actuators.

FIG. 1 below shows a cross sectional view of the optical switch taken through A—A of FIG. 1c. The support material of substrate 7 of FIG. 1, provides mechanical support for both the PZT actuator 1a and mirror (6). Each PZT actuator comprises unimorph thin film PZT layer 2 sandwiched between upper electrode 1 and lower electrode 3 to form the cantilever structures above the thin movable support sheet member (5). As mentioned later, FIG. 15 shows actuator stacks of multiple thin films which could thus employ multiple PZT layers rather than a single less complex unimorph layer. The mirror (6) is deposited on the underside of the easily flexed support sheet (5). Aforesaid hinge potions shaped as narrow tabs (4) of FIG. 1c and 1d are advantageously just areas within the support material located between the PZT actuators 1a and the mirror section 6, rather than discreet hinge devices. Thus the hinge areas are integral with the flexing support sheet (5) and are sufficiently thin and hence flexible so as to act as stress relieving hinge flexing areas, relieving stress from the stiffer actuators. The thickness is small enough to provide these flexible hinge regions 4 between each actuator and the edges of mirror 6 and thus permitting mirror motion and also providing the desired benefit of elimination of stress concentrations. In other words support sheet portions 4 adjacent movable terminal potions of the cantilevered actuators act as stress relieving hinge flexing areas, relieving stress from the actuators.

As explained below, the substrate (7) is removed from areas underneath the mirror area (6) to expose the reflective surface of mirror 6 to the light beams to be switched, as mentioned above in connection with FIG. 1d, and to allow for easy motion of the PZT actuators. The support material (5) is supported on each end by the fixed array substrate (7) as shown. Low voltages are applied by voltage sources 15a and 15b to the aforesaid electrodes 1 and 3. The voltage sources would actually comprise CMOS transistorized driving circuitry chip bonded at upper portions of FIG. 1. Having the voltage sources apply similar potentials to each piezoelectric cantilevered actuator 1a will flex the cantilevers in the same direction and produce motion parallel to the substrate. Applying opposing potentials to the cantilevers, indicated in FIG. 1, will produce a tilting motion around the axis located through the center of the mirror 6. Presently preferred materials for the piezoelectric unimorph actuator layer 2 are selected from the group consisting of quartz, barium titanate, polyvinylidene fluoride and lead zirconium titanate (PZT), the latter being most preferred.

A preferred method of making the switch involves the following steps.

Figure 2:
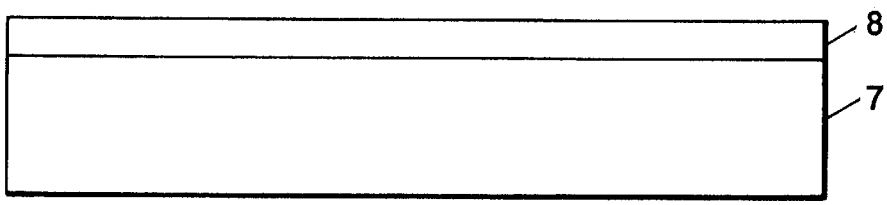
FIGS. 2–10 indicate various steps in the preferred process of making a preferred embodiment of a micro-mirrors.

Step #1: as indicated by FIG. 2, begin with a double side polished or single sided polished silicon wafer substrate (7). Deposit LPCVD (low pressure chemical vapor deposition) Silicon Nitride or Silicon Dioxide layer 8, 1–3 microns thick, by LPCVD (?? Chemical vapor deposition. This will be the support member 5 of FIG. 1.

Figure 3:
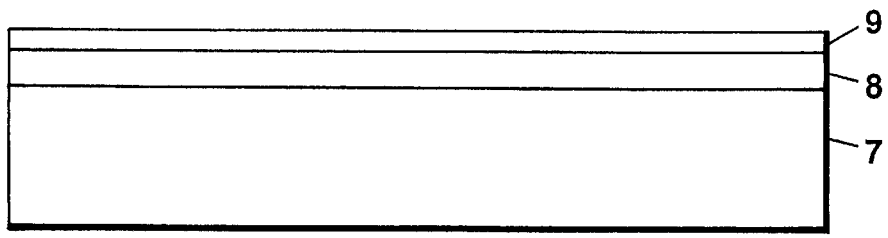

Step #2: As indicated by FIG. 3, sputter or evaporate bottom electrode material (9), preferably of 100–300 Angstroms of titanium for adhesion along with 1000–1500 angstroms of platinum on top.

Figure 4:
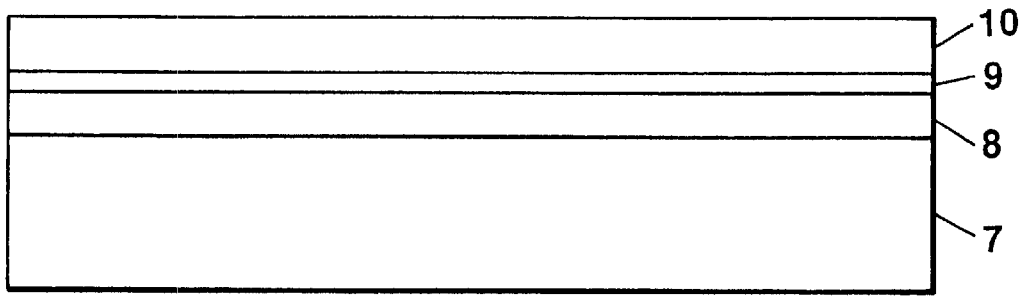

Step #3: As indicated by FIG. 4, deposit PZT material (10) using (metal oxide chemical vapor deposition (MOCVD), or SolGel Process, 0.5 to 1 micron thick.

Figure 5:
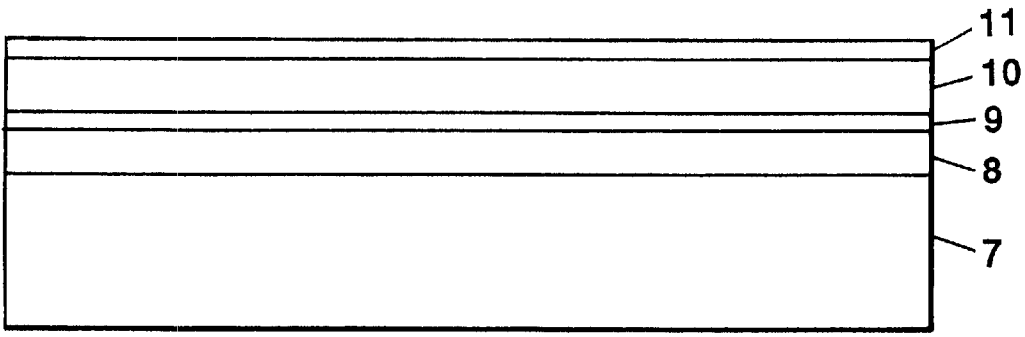

Step #4: As indicated by FIG. 5, sputter or evaporate Top Electrode (11) typically 1000–1500 Angstroms of platinum or gold.

Figure 6:
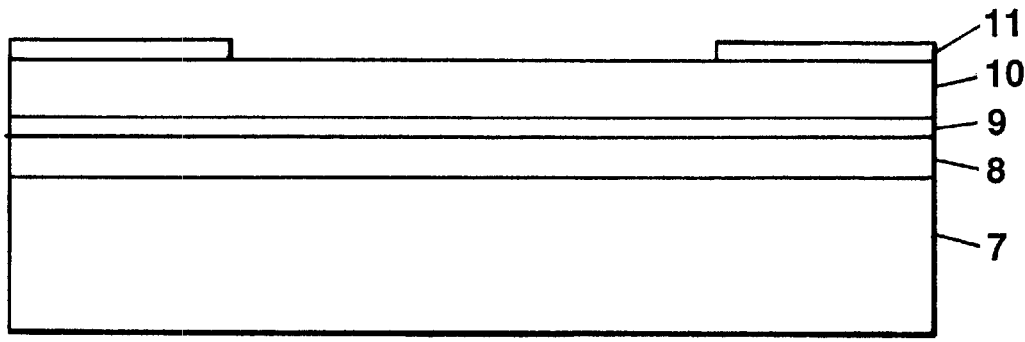

Step #5: As indicated by FIG. 6, etch top platinum electrode (11) using ion milling to form top electrode structure.

Figure 7:
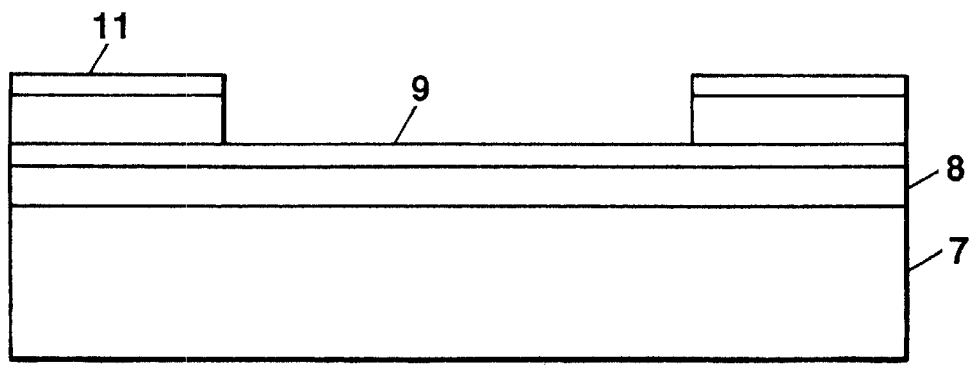

Step #6: As indicated by FIG. 7, etch PZT member (10) using either ion milling or, for a much faster etch, an ultrasonic chemical bath containing a mixture of HF:H-CI:DI water (1:15:284).

Figure 8:
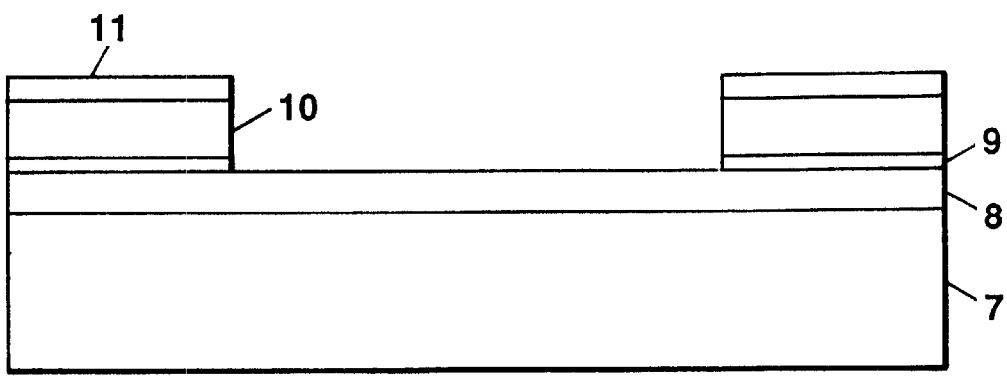

Step #7: As indicated by FIG. 8, etch bottom platinum and titanium adhesion layer (9) to form bottom electrode.

Figure 9:
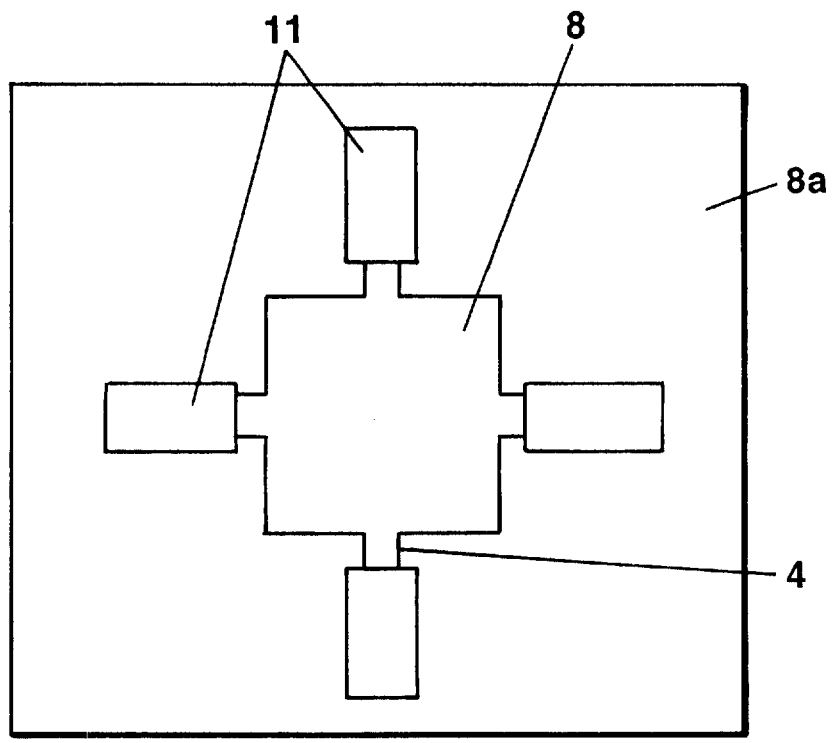

Step #8: As indicated by FIG. 9, etch support material (8) using reactive ion etching to form support structures for the PZT actuators (shown as top electrode 11) and the mirror (not shown). Top view is shown with PZT stacks covered with electrode (11). The PZT capacitor stack is covering underlying support material (8a) The flexing hinge portions of the support member are located (4) between the PZT stacks and the central square region of support material (8).

Thus as indicated in FIG. 9, taken in conjunction with FIG. 1c and 1d, the support layer portions 8a surrounding the optical switch are etched away by conventional etching methods within the area 8a except for the support layer portions 8 underlying the central mirror area and the areas underlying the actuators shown as upper electrode areas 11 and the hinge areas 4. The resulting product is as shown in FIG. 1c and 1d mounted at areas 7a within an associated aperture of substrate 7.

Figure 10:
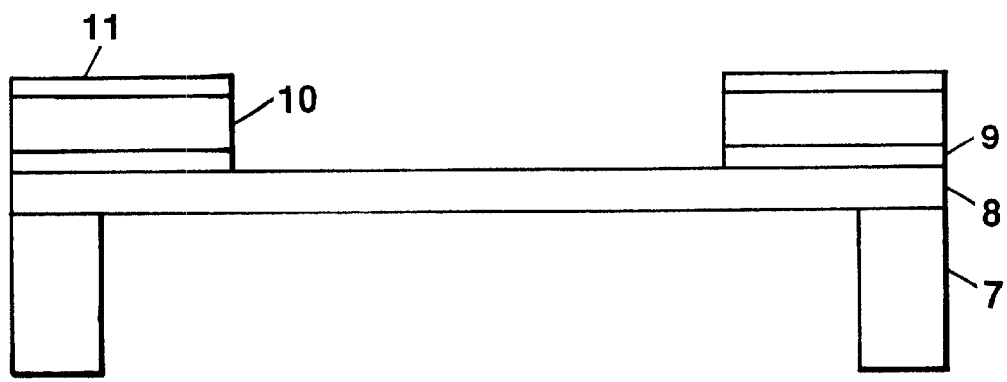

Step #9: As indicated by FIG. 10, etch substrate from beneath the support material (8) using deep reactive ion etching. This will create a free-floating central area with cantilevered actuators 1a in FIG. 1 on each side.

Figure 11A:
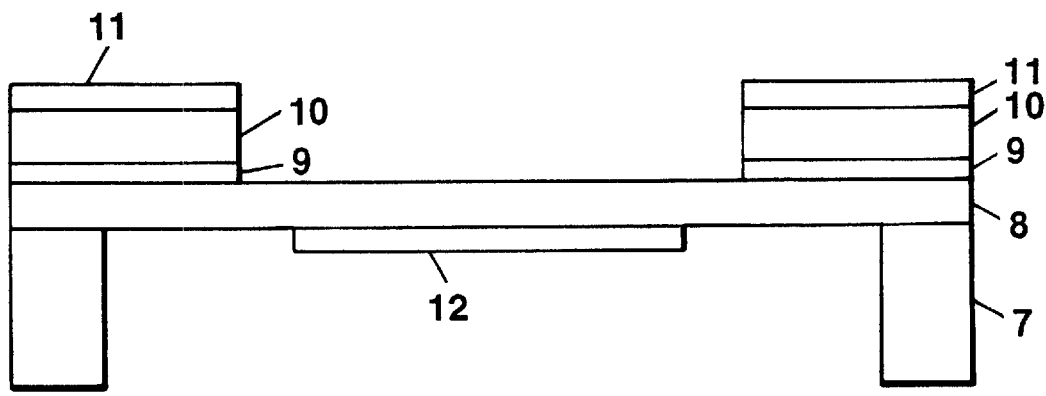
FIG. 11a shows the addition of mirror layer 12 to the structure shown in FIG. 10.

Step #10: As indicated by FIG. 11a, deposit mirror material (12) using evaporation and pattern using lift-off. Photoresist for lift-off patterning is the same photoresist pattern used for prior deep reactive ion etch step of step #9.

In order to drive the device by moving the actuators 1a, the electrodes 1 and 3 are taken out to bonding pads, not shown. These bonding pads are typically contacted via the widely used method known as flip chip bonding where a second microelectronic package having five volt CMOS driving circuitry, is brought into contact with the bonding pads electrically. This process is well known in the industry. The steps to form the insulating layers and metal interconnection and bonding pads for flip chip bonding have been omitted for simplification. Typical sputtering or evaporation techniques are used for metal interconnection and bonding pad deposition, and typically wet etching or ion milling is used for patterning the metal interconnection and bonding pads. Insulating layers are either silicon dioxide or silicon nitride and are deposited using plasma-enhanced chemical vapor deposition (PECVD). Vias are patterned into the insulating layers using reactive ion etching.

To summarize, the use of thin film piezoelectric actuation enables all materials and structures required to be fabricated, utilizing existing MEMS processes and the art of photolithography. The actuators for each mirror are spatially and accurately located within microns of the mirror by virtue of known photolithographic processes currently available in the MEMS and semiconductor industries. Finally, the use of extremely thin film piezoelectric material requires less than 5V DC for full actuation, which enables each mirror array to be packaged with its own CMOS-compatible driving circuitry creating a small form factor module.

Figure 11:
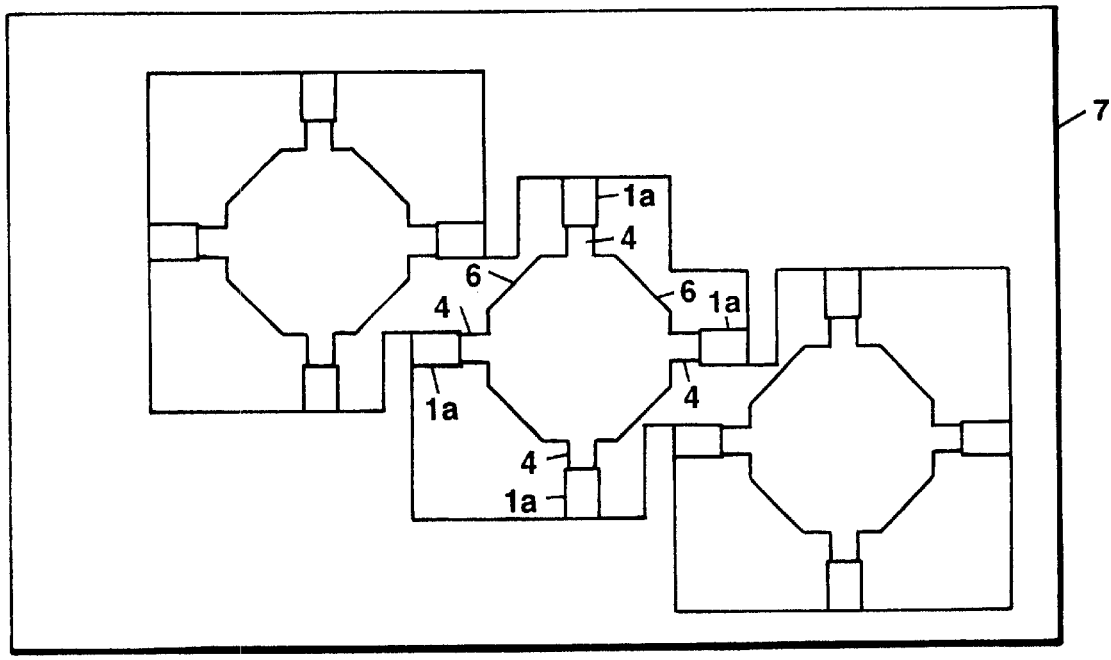
FIG. 11 shows another embodiment using a hexagonal central mirror which can provide for a higher mirror packing density.

In the embodiment of FIG. 11, a hexagonal central mirror is provided for producing higher mirror packing densities across the array substrate 7 by removing the corners from the movable support mirror areas 6 as shown. Four orthogonal actuators 1a coupled to the mirrors via the aforesaid flexible hinge regions 4, achieve two axis motion as before with the opposing voltage potentials shown in FIG. 1.

Figure 12:
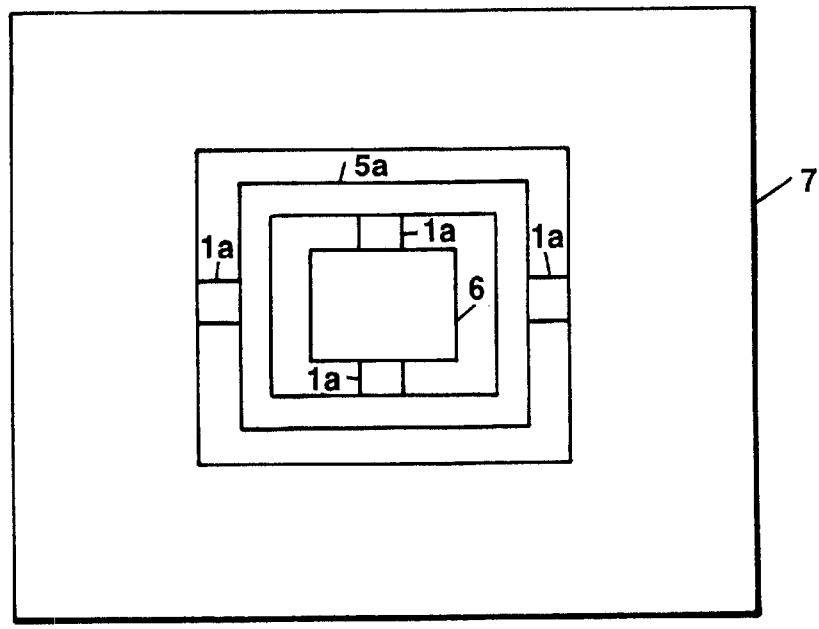
FIG. 12 shows another embodiment using a gimbal ring design for two axis motion.

The FIG. 12 embodiment uses a gimbal ring design for two axis motion as shown. The central portion is the mirror area 6 with two inner actuators 1a and two outer actuators located in perpendicular fashion. Inner actuators 1a are attached to the mirror portion 6 and to the outer support ring 5a which is in turn attached to the outer actuators 1a that are in turn attached to the substrate 7. For motion about the vertically oriented y-axis, the outer actuators are used in flexure motion with opposing voltage potentials. For motion about the horizontally oriented x-axis, the inner actuators are used in flexure motion with opposing voltage potentials.

Figure 13:
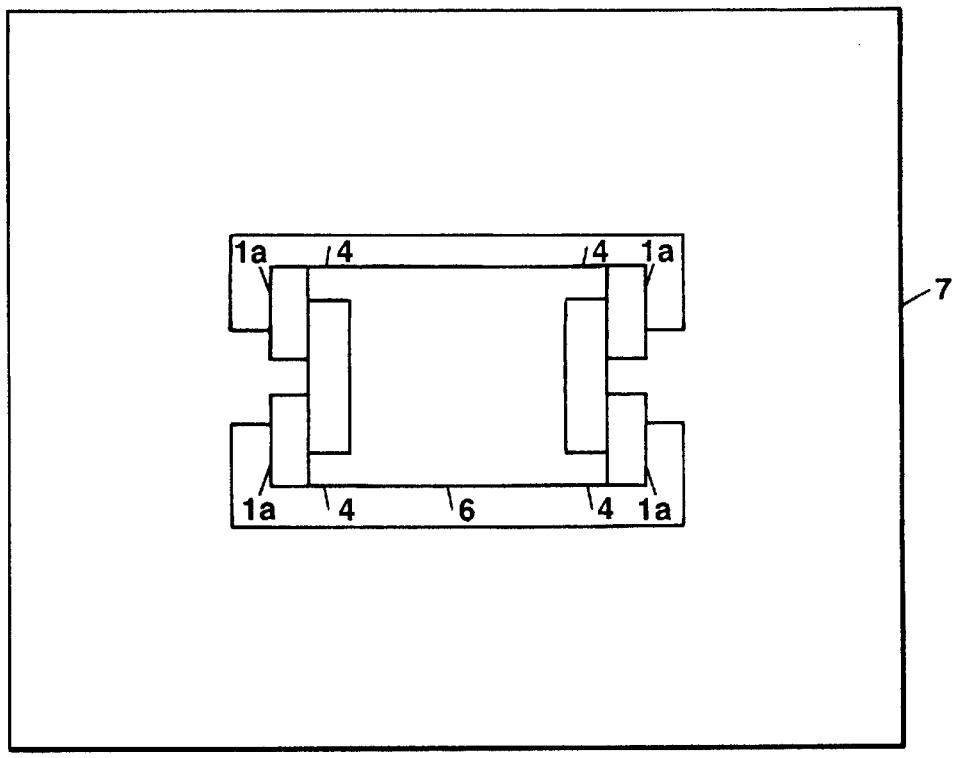
FIG. 13 shows a further embodiment having pairs of parallel actuators along two parallel side portions of the mirror support structure.

The FIG. 13 embodiment utilizes actuators 1a and hinge areas 4 that are on opposing sides of the mirror 6 as shown. For motion about the x-axis, the upper actuator 1a above the x-axis will have similar applied potential but opposite in polarization to the lower actuators. For motion about the y-axis, the actuators to the right of the y-axis will have similar applied potential but opposite in polarization to the left-hand actuators. Greater deflection may be achieved with this embodiment due to the lack of constraint on the top and bottom sides of the support material, however there may be a decrease in stability in comparison with embodiment with hinges and actuators on all four sides.

Figure 14:
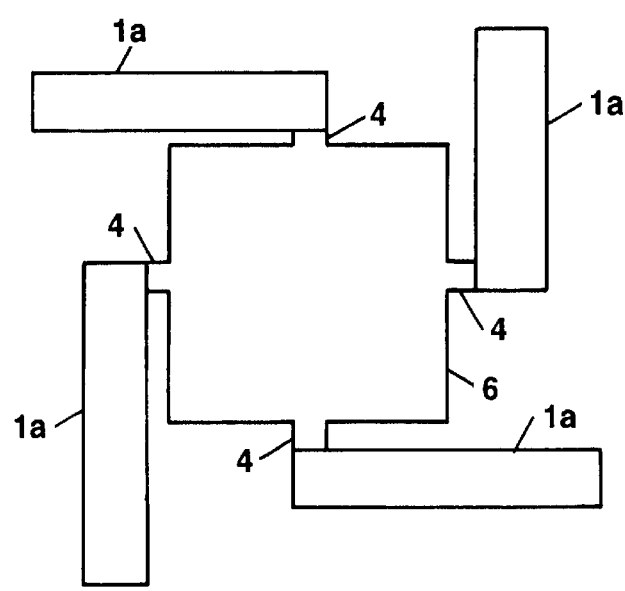
FIG. 14 shows a further embodiment wherein the actuators are positioned in parallel with respect to the mirror area edge portions, providing a compact design.

The FIG. 14 embodiment shows actuator 1a positioned in parallel with respect to edge portions of mirror 6. The actuators are coupled to the central mirror area via hinge or tab portions 4. This embodiment can provide greater compactness of the actuated mirrors relative to most of the aforesaid embodiments.

While a single piezoelectric capacitor is presently preferred, actuators could be employed as shown in FIG. 15. Four stacked PZT capacitors are shown for each actuator, each capacitor having electrodes 9 and 11 positioned above and below the PZT layer 10. Mirror surface 12, support layer 8 and substrate 7 are also illustrated.

The following further design details may be helpful to the skilled worker in the art.

Layer Thicknesses

The thicknesses of the metal layers used for the PZT capacitor stack, platinum and titanium, are typical of thicknesses used for metal connections and adhesion layers. Therefore, the values of 100–300 angstroms of titanium and 1000–1500 angstroms of platinum are used to provide adequate adhesion and metal connection. In comparison to the thicknesses of the other layers (PZT, mirror, support material), the metal layers are much thinner and, therefore, the influence on the mechanical properties of the overall structure is negligible.

The thickness of the support material, which can be either silicon dioxide or silicon nitride, is a major factor regarding both the resonance of the overall structure and the mechanical stability. Firstly, the resonance of the overall structure is proportional to both the device geometry and its mechanical properties as shown below for a simple cantilever beam derived; from the Bernoulli-Euler beam equation:

$$f \propto \frac{t}{L^2} \sqrt{\frac{E}{\rho}}$$

where, t=material thickness

L=material length

E=Young's modulus of material

ρ=material density

Therefore, a thicker support material will provide a higher resonance, which will produce a faster switch. Shorter lengths will also provide a higher resonance; however, shorter cantilevers will provide less deflection in comparison to longer cantilevers under similar actuation. So, optimization of the dimensions of the cantilevers must be made to achieve the desired amount of deflection with the desired switch speed, i.e., a faster switch may sacrifice amount of deflection. Although, by varying the thickness and cantilever dimensions, switches can be tailored for specific applications. A large cross connect array may need greater deflection in order to address a large area of fibers, whereas, an add/drop application may need a faster switch to add or drop traffic at a node to allow traffic to be passed to a local network or passed through.

Also, a stiffer material (higher Young's modulus) or less dense material will provide a higher resonance frequency:. In our case, Young's modulus values for thin film silicon nitride range from 290 to 380 GPa whereas values for thin film silicon dioxide are around 75 GPa. Density values are 3.1 g/cm$^3$ and 2.2 g/cm$^3$ for silicon nitride and silicon dioxide, respectively. However, a stiffer material will provide less deflection at the end of the cantilever, which, in turn, will provide a lower excursion angle for the actuated mirror. This can be seen by the equation for the maximum deflection of a cantilever beam for a given force on the beam shown below:

$$y_{max} \propto \frac{L^3}{EI}$$

where,
L=length of cantilever
E=Young's modulus of cantilever
I=moment of inertia of cantilever The thickness of the PZT layer also factors into the resonance and mechanical stability of the overall structure. Taking into account the 2 equations stated above, similar arguments can be made for the dimensions of the PZT layer. A thicker layer will provide a higher resonance, but will sacrifice the deflection. A longer PZT section will provide greater deflection, but with a lower resonance. The situation is further complicated by the fact that the PZT layer is also the electromechanical coupling layer, i.e., upon application of a voltage to the PZT, mechanical actuation occurs which is proportional to the applied voltage and the dimensions and properties of the PZT. This relationship is shown below:

$$\frac{\Delta l}{l} = d_{31} \frac{V}{t}$$

where,
l=length of PZT section
d=piezoelectric coefficient (in this case, the 1$^{st}$ subscript, 3, denotes electrodes on the top and bottom of the PZT material, and the 2$^{nd}$ subscript, 1, denotes actuation in the transverse direction, i.e., lengthwise.)
V=applied voltage
t=thickness of PZT Therefore, as the PZT thickness decreases, for a given voltage, the amount of actuation, $\Delta l$, increases. However, a thinner PZT layer has a lower breakdown voltage and, recent research has shown that the piezoelectric coefficient of thin film PZT increases With thickness. Again, one can see that the PZT thickness must be optimized for specific applications with respect to the applied voltage and amount of actuation desired.

The thickness of the mirror material also plays a factor in the overall resonance of the device. Arguments can be made in similar fashion with respect to the support material. Thicker mirror material and smaller mirror area will provide a higher resonance for the overall structure, and thus a faster switch. However, the mirror acts as a counter force against the actuators. Therefore, for a heavier mirror (i.e. thicker, or a larger area), greater actuation force will be required which will require higher voltages or thicker PZT. Furthermore, the mirror area must be large enough to focus the light beam coming from the optical fiber. Also, the thickness must be great enough to provide high reflection in the 1500 nm wavelength range. So, the mirror material must be optimized for the specific application with respect to thickness, mirror area, desired actuation and applied voltage.

Because of the above relationships between material thicknesses, material types, and desired operation of the switch, in-depth optimization must be performed to achieve the desired switch characteristics for given applications. The thickness ranges of the materials mentioned above for our invention lie within the practical means of current microfabrication methods while maintaining the structural integrity of the switch and providing a range of switch speeds application to the field of the invention.

In explanation of the hinges, it would be more appropriate to address them as hinge areas. The hinge areas are different from typical hinges found on a door. The hinge areas are of the same material as the support material over which the PZT actuators and the mirror material are deposited. Essentially, the hinge areas are areas of the support material which are not covered with either PZT or mirror material and is typically the area where the cantilevers attach to the mirror and is usually of smaller width than the cantilever. The hinge areas provide a flexing area, which relieves stress from the cantilevers, and the mirror area upon actuation. The hinge areas will flex more than either the cantilevers or the mirror due to the hinge areas being less wide as shown by the elastic section modulus relationship denoted below assuming a rectangular cross section:

$$S \propto I = \frac{1}{12} wt^3$$

where,
S=elastic section modulus
I=moment of inertia of feature
w=width of feature
t=thickness of feature A lower elastic section modulus denotes a less stiff area. Therefore, the hinge areas being of less width than the cantilevers or the mirror have a lower elastic section modulus and will flex more. However, the hinge areas also factor into the overall motion of the switch. The hinge areas must be wide enough to provide adequate structural support between the cantilevers and the mirror. The hinge areas must flex enough to enable the desired excursion angle, however, too much flexure can produce spring-like oscillations as the mirror is positioned. Therefore, the elastic section modulus, S, of the hinge area must be high enough to counter the spring-like motion, but low enough to provide adequate flexure to achieve the desired excursion angle. Finally, one can see that the hinge dimensions along with the actuator and mirror dimensions are all related through a set of equations that should be optimized to achieve the best performance of the optical switch.

Since variations in the various described embodiments will become apparent to the skilled worker in the art, the scope of the invention is to be restricted only by the terms of the following claims and art recognized equivalents thereof The term "micro-mirror" is directed to mirrors having a length and width of about 500 microns or less. The terms calling for thin film piezoelectric materials within the actuators are directed to films having a thickness of between 0.5 and 20 microns. Piezoelectric actuator materials can include barium titanate, zinc oxide, zirconium titanate or polyvinylidene fluoride which is a piezoelectric polymer. The currently preferred piezoelectric actuator material is PZT (zirconium titanate), the preferred PZT thickness being within the range of 0.5–1 microns. The "thin movable support member" has a preferred thickness of between 1 and 3 microns, and the thin reflective mirror surface has a preferred thickness of between 0.2 and 1 micron.

What is claimed is:

1. A method of making by thin film deposition techniques a micro-mirror light beam switch having a thin movable support member (5) for supporting a thin central reflective mirror surface (6) thereon and for supporting a plurality of thin piezoelectric cantilevered mirror actuators (1a) mechanically coupled between a fixed substrate (7) and movable portions of said thin movable support member comprising the steps of:

(a) depositing by chemical vapor deposition a support material layer (8) of silicon nitride or silicon dioxide of 1–3 microns thickness upon a silicon wafer substrate (7);

(b) thereafter depositing by sputtering or evaporation, bottom electrode layer (9) by sputtering or evaporation of 100–300 angstroms of titanium for adhesion and then depositing 1000–15000 angstroms of platinum;

(c) thereafter depositing by chemical vapor deposition or SolGel process, PZT piezoelectric layer (10) to a thickness of between 0.5 and 1.0 microns;

(d) thereafter depositing by chemical vapor deposition or evaporation, 1000–1500 angstroms of platinum or gold, forming a top electrode layer (11);

(e) thereafter etching said top electrode layer using ion milling to form top actuator electrode structure;

(f) etching piezoelectric layer (10) using ion milling to remove piezoelectric material from areas between said top actuator electrode structure;

(g) etching bottom electrode layer (9) to form bottom actuator electrode structure;

(h) etching support material (8) to form support structures for said thin piezoelectric cantilevered mirror actuators (11) and the mirror;

(i) etching substrate from beneath the support material (8) to create a free-floating central mirror area with cantilevered mirror actuators on each side; and (j) depositing reflective mirror material (12) to thickness of between 0.2 and 1.0 microns.

2. A method of making by thin film deposition techniques a micro-mirror light beam switch having a thin movable support member (5) for supporting a thin central reflective mirror surface (6) thereon and for supporting a plurality of thin piezoelectric cantilevered mirror actuators (1a) mechanically coupled between a fixed substrate (7) and movable portions of said thin movable support member comprising the steps of:

(a) depositing a layer (8) of silicon nitride or silicon dioxide layer of 1–3 microns thickness upon a substrate (7);

(b) thereafter depositing bottom electrode layer (9);

(c) thereafter depositing piezoelectric layer (10) to a thickness of between 0.5 and 20 microns;

(d) thereafter depositing top electrode layer (11);

(e) etching a top electrode structure;

(f) etching piezoelectric layer (10) to remove piezoelectric material from areas between said top electrode structure;

(g) etching bottom electrode layer (9) to form bottom actuator electrode structure;

(h) etching support material (8) to form support structures for said thin piezoelectric cantilevered mirror actuators piezoelectric actuators (11) and said reflective mirror surface;

(i) etching said substrate from beneath the support material (8) to create a free-floating central area with said cantilevered mirror actuators on opposite sides thereof; and (j) depositing reflective mirror material (12).

3. The method of claim 2 wherein said piezoelectric layer is selected from the group consisting of barium titanate, zinc oxide, lead zirconium titanate (PZT) and polyvinylidene fluoride.

4. The method of claim 3 wherein said piezoelectric layer is lead zirconium titanate (PZT).

5. The method of claim 2 wherein said piezoelectric layer is deposited to a thickness within the range of 0.5–1 microns.

6. The method of claim 3 wherein said piezoelectric layer is deposited to a thickness within the range of 0.5–1 microns.

7. The method of claim 4 wherein said piezoelectric layer is deposited to a thickness within the range of 0.5–1 microns.

8. The method of any one of claims 2–7 wherein said reflective mirror material is deposited to a thickness of between 0.2 and 1.0 microns.

9. The method of any one of claims 2–7 wherein said top electrode layer is platinum or gold, deposited to a thickness of 1000–1500 angstroms.

10. The method of any one of claims 2–7 wherein said bottom electrode layer is formed by depositing 100–300 angstroms of titanium for adhesion, then 1000–1500 angstroms of platinum over said titanium.

11. The method of claim 8 wherein said bottom electrode layer is formed by depositing 100–300 angstroms of titanium for adhesion, then 1000–1500 angstroms of platinum over said titanium.

12. The method of claim 9 wherein said bottom electrode layer is formed by depositing 100–300 angstroms of titanium for adhesion, then 1000–1500 angstroms of platinum over said titanium.

13. The method of any one of claim 2–7 wherein etching of said piezoelectric layer in accordance with step (f) is rapidly performed by the use of an ultrasonic chemical bath containing a mixture of HF:HCI:DI water.

* * * * *